US009661745B1

(12) United States Patent
Yazzie et al.

(10) Patent No.: US 9,661,745 B1
(45) Date of Patent: May 23, 2017

(54) VACUUM LAMINATION OF DEPTH-SENSING CAMERA MODULE PCB TO STIFFENER USING BUILT-IN VACUUM CHANNELS

(71) Applicant: Intel Corporation, Santa Clara, CA (US)

(72) Inventors: Kyle Yazzie, Chandler, AZ (US); Pramod Malatkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/979,089

(22) Filed: Dec. 22, 2015

(51) Int. Cl.
*H04N 5/225* (2006.01)
*H05K 1/02* (2006.01)
*H05K 3/00* (2006.01)
*H04N 5/374* (2011.01)

(52) U.S. Cl.
CPC ......... *H05K 1/0271* (2013.01); *H04N 5/2252* (2013.01); *H04N 5/2254* (2013.01); *H04N 5/374* (2013.01); *H05K 3/0058* (2013.01)

(58) Field of Classification Search
CPC .... H05K 1/0271; H05K 3/0058; H04N 5/374; H04N 5/2254; H04N 5/2252
See application file for complete search history.

(56) References Cited

U.S. PATENT DOCUMENTS

| | | | | |
|---|---|---|---|---|
| 5,105,259 A | * | 4/1992 | McShane | H01L 21/565 257/667 |
| 5,374,021 A | * | 12/1994 | Kleinman | B25B 11/005 248/362 |
| 6,371,430 B1 | * | 4/2002 | Vernackt | B25B 11/005 248/362 |
| 2007/0287222 A1 | * | 12/2007 | Natsume | B23K 20/004 438/104 |
| 2008/0315375 A1 | * | 12/2008 | Eichelberger | H01L 21/6835 257/659 |
| 2014/0035084 A1 | * | 2/2014 | George | H01L 27/1469 257/432 |
| 2016/0013394 A1 | * | 1/2016 | Savoia | H01L 41/0825 310/331 |
| 2016/0218264 A1 | * | 7/2016 | Tischler | H01L 33/62 |

* cited by examiner

*Primary Examiner* — Aung S Moe
(74) *Attorney, Agent, or Firm* — Blakely, Sokoloff, Taylor & Zafman LLP

(57) ABSTRACT

In accordance with disclosed embodiments, there are provided methods, systems, and apparatuses for vacuum lamination of a depth-sensing camera module PCB to a stiffener using built-in vacuum channels. For instance, there is disclosed in accordance with one embodiment means for assembling an electronics module, in which such means include at least affixing a plurality of top-side components to a top side of a printed circuit board; affixing a plurality of bottom-side components to the bottom side of the printed circuit board; sealing a stiffener plate to the bottom side of the printed circuit board, in which the stiffener plate includes a plurality of cavities to accommodate the plurality of bottom-side components affixed to the bottom side of the printed circuit board, and further in which the plurality of cavities are interconnected via one or more channels; applying a vacuum to the stiffener plate via a vacuum port of the stiffener plate to pull the printed circuit board onto the stiffener plate; and bonding the stiffener plate to the bottom side of the printed circuit board while the printed circuit board is held to the stiffener plate via the vacuum. Other related embodiments are disclosed.

25 Claims, 11 Drawing Sheets

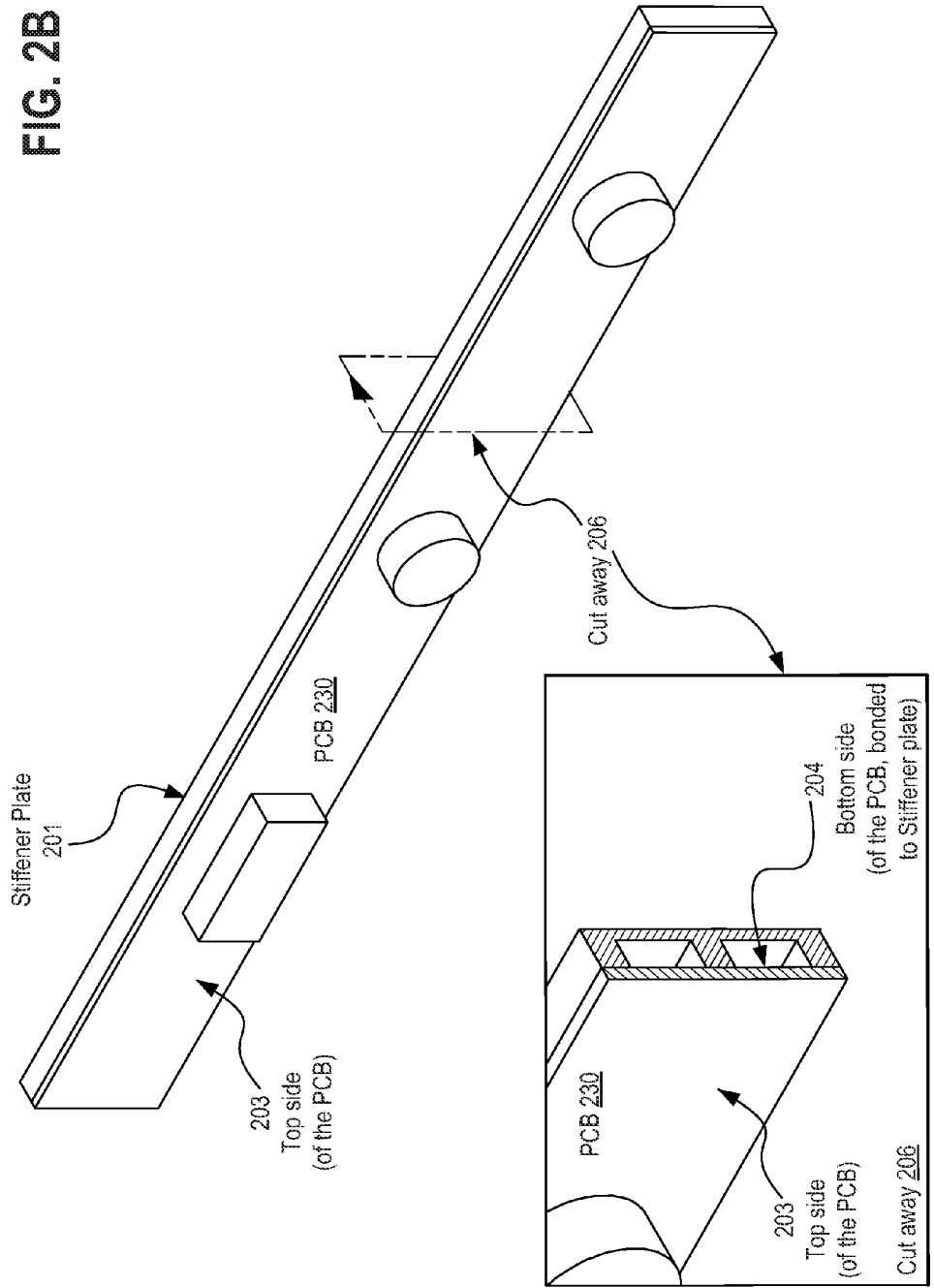

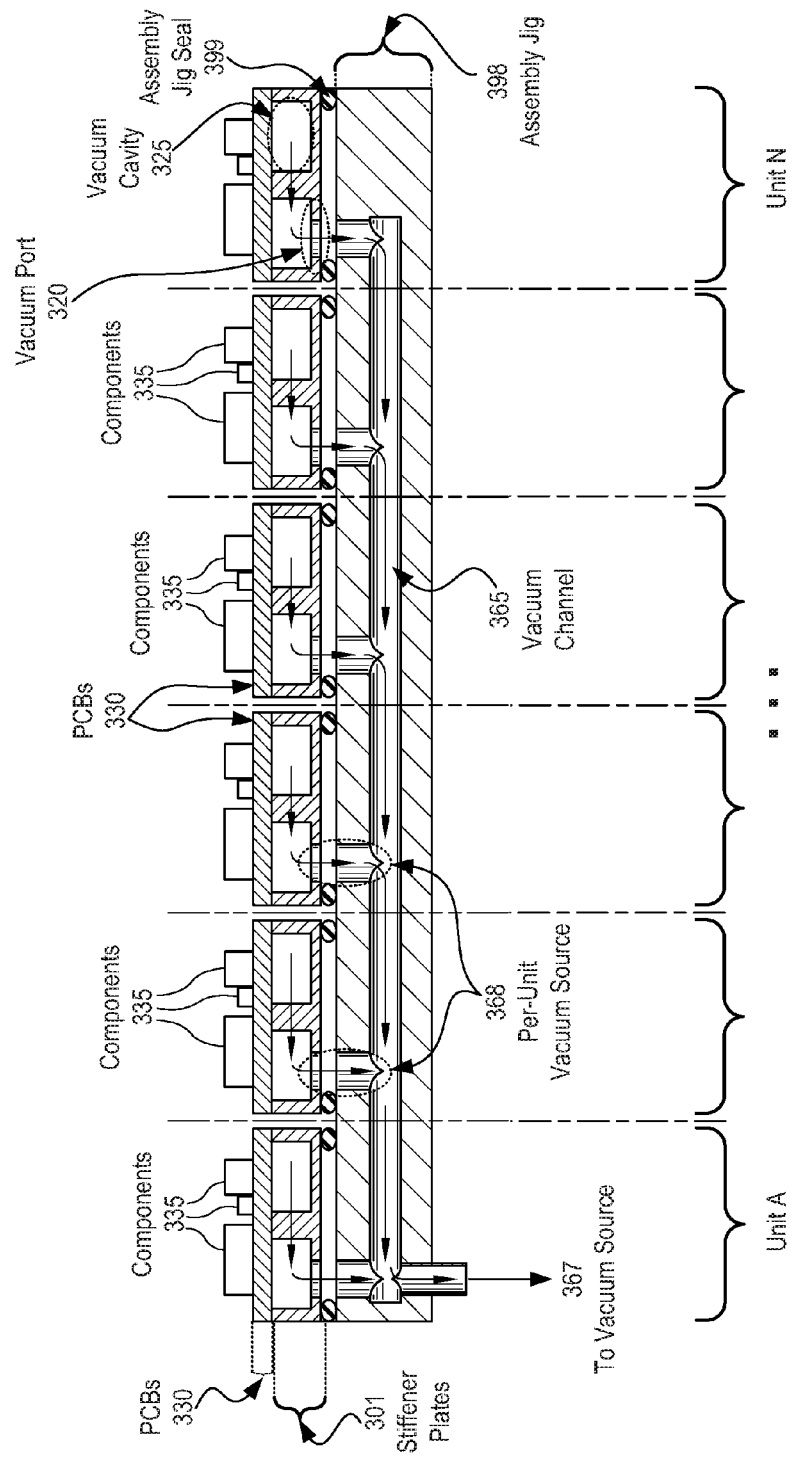

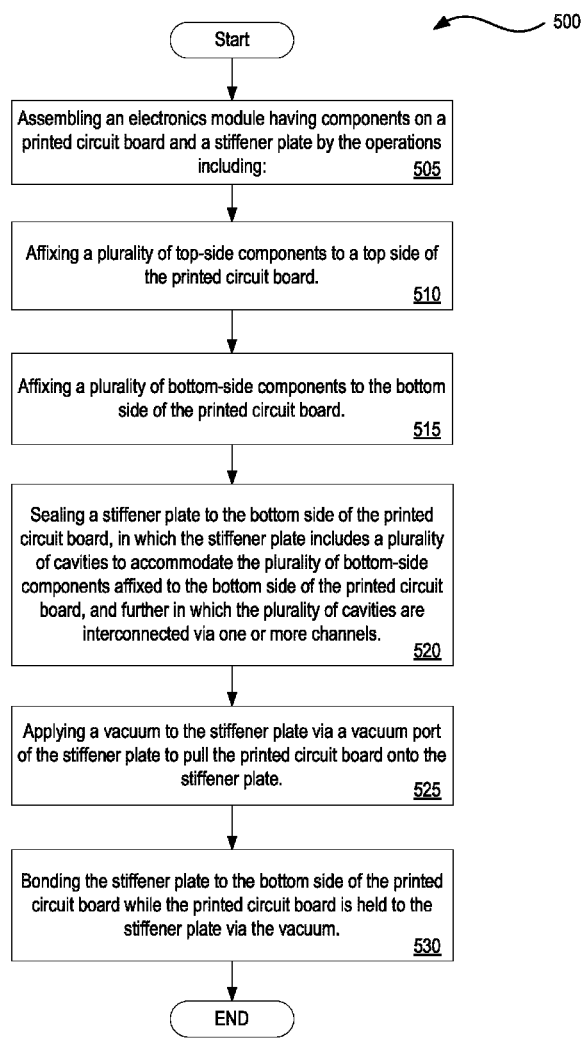

VACUUM LAMINATION OF DEPTH-SENSING CAMERA MODULE PCB TO STIFFENER USING BUILT-IN VACUUM CHANNELS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to vacuum lamination of a depth-sensing camera module PCB to a stiffener using built-in vacuum channels.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

As camera technology continues to advance it is now becoming commonplace for three dimensional cameras to enter the marketplace ranging from professional high end 3D cameras to simple "point and shoot" and inexpensive consumer cameras.

Unlike Single Lens Reflex or "SLR" cameras and Digital Single Lens Reflex or "DSLR" cameras, three-dimensional cameras are not limited to a single focal length, but rather, have depth determination capabilities with many three-dimensional cameras utilizing stereo camera technology for which there are two or more lenses, each with a separate image sensor, and in which the two or more lenses allow the camera to capture three-dimensional images through a process known as stereo photography. With such stereo cameras, triangulation is used to determine the depth to an object in a scene using a process known as correspondence.

For instance, given two or more images of the same three-dimensional scene, taken from different points of view via the two or more lenses of the stereo camera, correspondence processing requires identifying a set of points in one image which can be correspondingly identified as the same points in another image by matching points or features in one image with the corresponding points or features in another image.

Critically, however, the 3D camera must be finely calibrated such that the triangulation processing may be performed correctly. Therefore, unlike single-focal-length 2D cameras, 3D cameras are very sensitive to even small displacements of their internal components.

Even small amounts of physical deformation of the 3D camera's circuitry causes mis-calibration and degrades the 3D camera's ability to accurately determine depth to the objects in a scene.

The present state of the art may therefore benefit from the means for vacuum lamination of depth-sensing camera module PCBs to a stiffener using built-in vacuum channels as described herein.

BRIEF DESCRIPTION OF THE DRAWINGS

Embodiments are illustrated by way of example, and not by way of limitation, and will be more fully understood with reference to the following detailed description when considered in connection with the figures in which:

FIGS. 2A and 2B depict an exemplary stiffener plate affixed to a PCB with cut-away views in accordance with described embodiments;

FIG. 3 depicts an exemplary assembly jig and vacuum channel in accordance with described embodiments;

FIG. 5 is a flow diagram illustrating a method for vacuum lamination of a depth-sensing camera module PCB to a stiffener using built-in vacuum channels in accordance with described embodiments;

DETAILED DESCRIPTION

Figure 1:
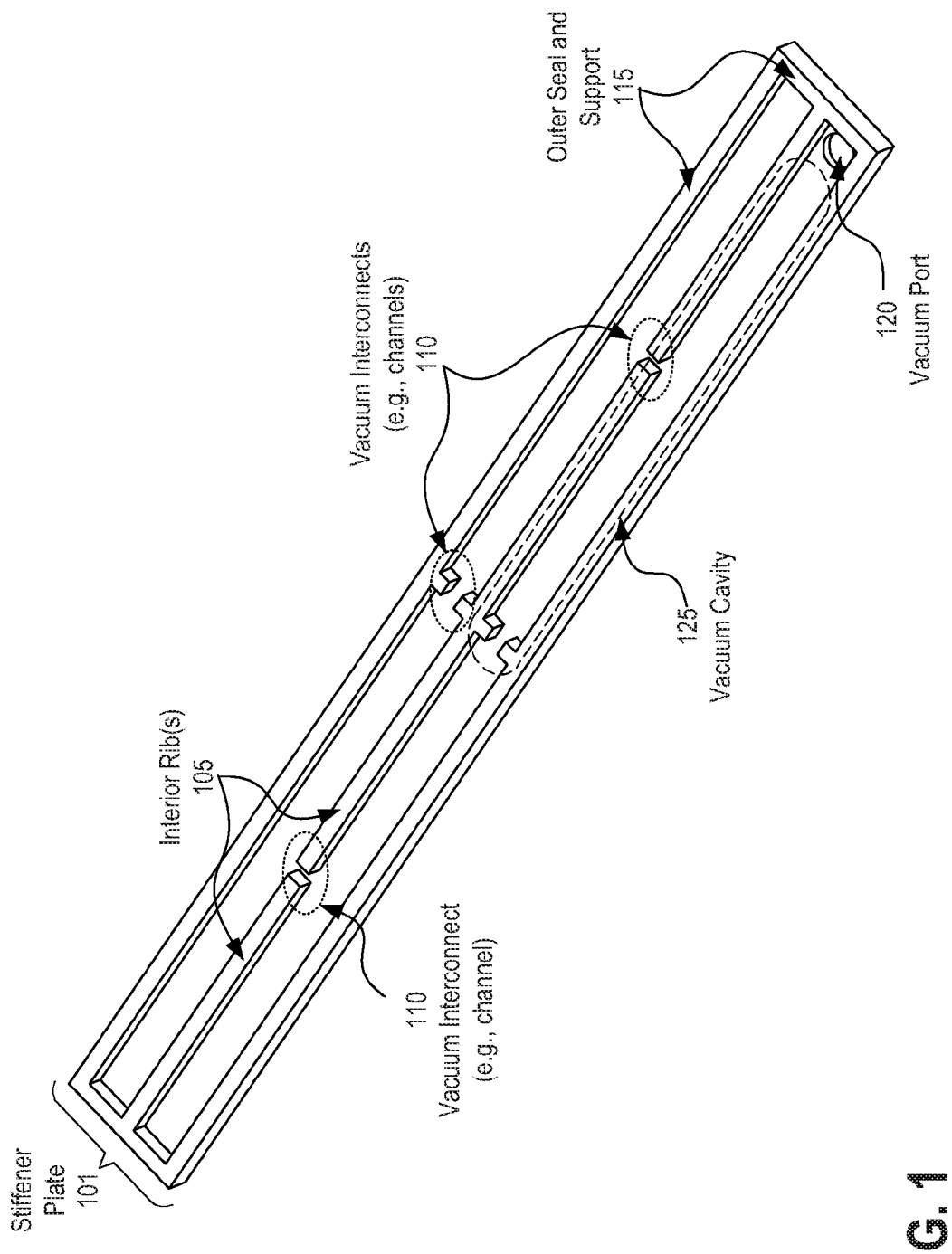
FIG. 1 depicts an exemplary stiffener plate in accordance with which embodiments may operate.

Described herein are systems, apparatuses, and methods for vacuum lamination of depth-sensing camera module PCBs to stiffeners using built-in vacuum channels. For instance, there is disclosed in accordance with one embodiment means for assembling an electronics module, in which such means include at least affixing a plurality of top-side components to a top side of a printed circuit board; affixing a plurality of bottom-side components to the bottom side of the printed circuit board; sealing a stiffener plate to the bottom side of the printed circuit board, in which the stiffener plate includes a plurality of cavities to accommodate the plurality of bottom-side components affixed to the bottom side of the printed circuit board, and further in which the plurality of cavities are interconnected via one or more channels; applying a vacuum to the stiffener plate via a vacuum port of the stiffener plate to pull the printed circuit board onto the stiffener plate; and bonding the stiffener plate to the bottom side of the printed circuit board while the printed circuit board is held to the stiffener plate via the vacuum.

Modern three-dimensional (3D) camera technology requires that the stereoscopic lenses, optics, and other circuitry and components of such cameras not only be calibrated to a high degree of precision, but they further require that the various components remain in strict alignment and hold fast to their relative positions.

Any kind of sharp jarring, such as a drop, bending, twisting, and even temperature changes which cause the materials to expand, contract, or otherwise deform or become displaced from their correct position, are likely to bring the 3D camera's components into misalignment and thus degrade the camera's depth sensing accuracy.

Stiff frames, backing places, and so-called stiffeners are therefore utilized at the time of manufacture to create a rigid frame by which the camera's PCB (Printed Circuit Board) and its components may be reinforced with the aim of keeping the camera's components in strict alignment.

A typical solution for constructing such a frame at the time of manufacture is to simply glue the PCB module and all of its components and circuitry onto a flat piece of metal. This is a workable solution, but it has several drawbacks and is therefore not an ideal solution.

One problem with such a solution is that gluing the PCB module and all of its components and circuitry onto a flat piece of metal necessitates that the underside of the PCB board be completely flat and void of any components. However, as technology advances and consumer demand drives miniaturization of electronic devices such as smartphones, tablets, and other hand-held electronics, there is a push to maximize utilization of any available amount of board space so that, quite literally, modern consumer electronics have no part of their circuit board that is not populated with components, circuitry, capacitors, or some functional element that provides a function to the device. Any empty space identified during board tape outs and design is treated by engineers as an opportunity to either add functionality, thus filling the non-used space, or to reduce the size of the device by reducing the size of the board, thus eliminating the space.

In this context, although it is possible to simply glue the PCB module and all of its components and circuitry onto a flat piece of metal, such a solution simply is not satisfactory as it wastes an entire backside or underside of the board.

The above problem is also exacerbated by the manufacturing processes involved with gluing the PCB module and all of its components and circuitry onto a flat piece of metal. This is because it is not sufficient to simply glue the PCB to a stiffener. Rather, modern manufacturing techniques utilize what are called "no touch" zones meaning those spaces or zones cannot be utilized (e.g., or touched) by any components, circuitry, etc. The no-touch zones are then utilized as press points for mechanically pressing the PCB against a stiffener plate while a glue or adhesive cures. Alternatively, the no-touch zones are utilized as clamping points to mechanically hold or fasten the PCB against a stiffener plate while the glue or adhesive cures.

The mechanical fastening of the PCB board being glued against the stiffener plate is necessary because it possible that the PCB board exhibits some pitch or warping and will therefore not lie perfectly flat upon the stiffener plate. Moreover, the gluing or adhesion process simply performs better when there is pressure between the PCB board being glued and the stiffener plate receiving the PCB.

Described herein are therefore means by which PCBs may mated with a stiffener plate having channels or cavities cut away to make room for underside components, thus permitting more useable space on the PCB for components and circuitry, and further described are means by which the PCB may be glued or affixed to such a stiffener plate with channels which are configured in such a way to operate as built-in vacuum channels during manufacture such that the PCB may be glued to the stiffener plate using vacuum pressure rather than a mechanical press, or mechanical clips. In such a way, the conventional "no-touch" zones may thus be wholly eliminated, which in turn frees up additional space for functional components.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

FIG. 1 depicts an exemplary stiffener plate 101 in accordance with which embodiments may operate.

In particular, there is depicted the stiffener plate having a series of cut outs or cavities which permit additional components and circuitry of a main board, microprocessor board, Printed Circuit Board (PCB), or other electronics board to be located on a bottom side of such a board without interfering or obstructing the mounting of the board to the stiffener plate 101 as such components and circuitry would be accommodated by, and positioned within, the empty space of the cavities.

As depicted, the cavities are configured in such a way to form vacuum cavities 125 which are interconnected by way of vacuum interconnects 110 forming channels or air passage ways amongst the vacuum cavities 125 of the stiffener plate. The outer seal and support 115 surrounds the entire perimeter of the stiffener plate such that, once mounted, the board will completely seal in the vacuum cavities of the stiffener plate 101 with the exception of the vacuum port 120 which is located on the bottom of the stiffener plate 101 and will therefore not be sealed off by the board when mounted.

The interior ribs 105 and the outer seal and support 115 serve the function of mechanically supporting and mounting the board to the stiffener plate so as to hold it fast and prevent deformation or displacement in the position of any of the components mounted to the board.

The vacuum interconnects 110 provide a connection between the various vacuum cavities 125 through which air may flow when the stiffener plate is sealed off by the board and then subjected to a vacuum to evacuate the air in the vacuum cavities 125.

Rather than having isolated or closed off cavities in the stiffener plate to permit additional room for bottom side components on the PCB, the cavities are interconnected by way of the vacuum interconnects 110 and once sealed, the stiffener plate may then be attached to a vacuum source or a vacuum line or an assembly jig by way of vacuum port 120 to create a negative pressure in the cavities in which the atmospheric pressure is reduced sufficiently in the cavities and through the vacuum interconnects 110 to laminate, glue, or otherwise affix the PCB module onto the stiffener plate 101 without necessitating the PCB module be physically clamp to the stiffener plate 101 or mechanically pressed down upon the stiffener plate 101 as was done with conventional manufacturing methods.

Figure 2A:
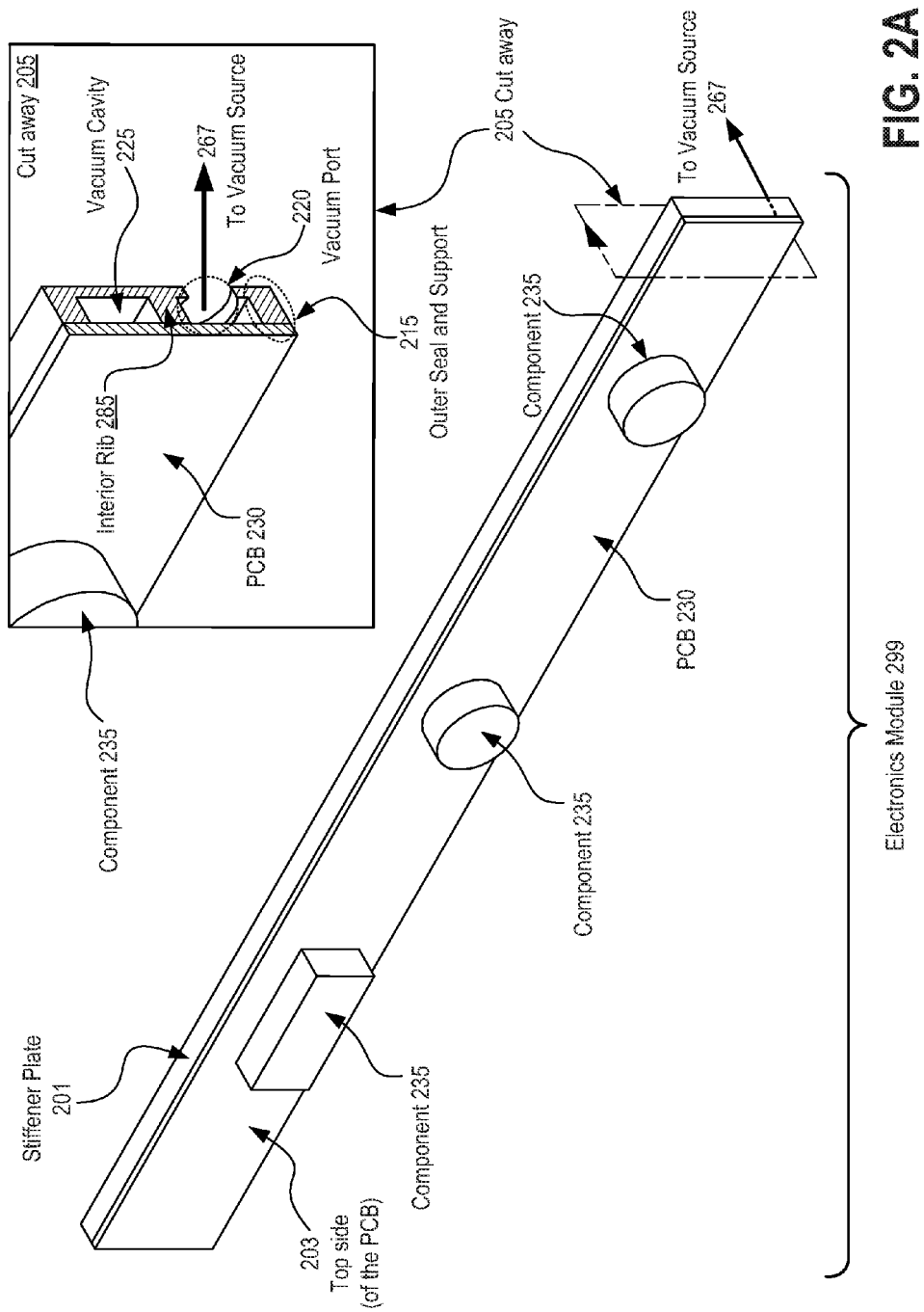

FIGS. 2A and 2B depict an exemplary stiffener plate 201 affixed to a PCB 230 with cutaway views (205, 206) in accordance with described embodiments. In particular, there is depicted the stiffener plate 201 as attached to the bottom side of the PCB 230 (also referred to as a PCB, a PCB module, a PCB board, or simply a board). Upon the top side 203 of the PCB 230 there is depicted components 235 (e.g., circuitry, capacitors, dies, processors, lenses, memory, etc.) and at the right most end there is a cut away 205 view of the assembled stiffener plate 201 and PCB 230.

The stiffener plate 201 and PCB 230 with its respective components 235 form an electronics module 299, such as that which would be utilized in a smart phone, tablet, 3D camera, or other various consumer electronics.

In the FIG. 2A cut away 205 view of the assembled stiffener plate 201 and PCB 230 at the upper right in the inset box it can be seen from the cross section that there is a vacuum cavity 225, interior rib 285, and a vacuum port 220 depicted. Further depicted is an outer seal and support 215 which surrounds the entire perimeter of the stiffener plate 201 such that, once mounted, the PCB 230 will completely seal in the vacuum cavities 225 of the stiffener plate 201 with the exception of the vacuum port 220 which may then be connected to a vacuum source 267.

In the FIG. 2B cut away 206 view of the assembled stiffener plate 201 and PCB 230 at the lower left in the inset box it can be seen from the cross section that there is a bottom side 204 of the PCB which is bonded to the stiffener plate, as depicted. Components are affixed to the bottom side 204 of the PCB in accordance with described embodiments and the PCB, when bonded to the stiffener plate, has the bottom side components aligned with the cavities, pockets, or openings in the stiffener plate such that the components may be accommodated on the bottom side 204, notwithstanding the presence of the stiffener plate 201 having been bonded to the PCB.

FIG. 3 depicts an exemplary assembly jig 398 and vacuum channel 365 in accordance with described embodiments. As depicted here, the vacuum channel 365 is part of the assembly jig 398 for use in manufacturing and does not form part of the consumer product. In this particular embodiment, there is depicted a multi-unit assembly jig 398 capable of applying a vacuum source 367 to multiple units simultaneously. As depicted, the assembly jig 398 simultaneously services units A . . . N. Each of the depicted units rests upon the assembly jig 398 such that each respective unit's vacuum port 320 is connected with the per-unit vacuum sources 368 on the assembly jig 398.

The assembly jig 398 is sealed against a bottom side of each of the units A . . . N respective stiffener plates 301 by way of an assembly jig seal 399, such as a gasket, grommet, or other material capable of sealing the air space which exists between the bottom of the units A . . . N stiffener plates 301 and the assembly jig 398 such that the vacuum source 367 may attain the requisite negative pressure.

Resting upon the topside of assembly jig 398 are the PCBs 330 and stiffener plates 301 for each of units A . . . N, in which each of units A . . . N is further depicted as having vacuum cavities 325 and components 335. Notably, it is not required to have "no-touch" zones for the purposes of unit assembly as clips, clamps, or press-points are supplanted through the use and application of the per-unit vacuum source 368 which provides the requisite down pressure (or pulling or vacuum force) to holdfast the units A . . . N against their respective stiffener plate 301 during assembly.

While the stiffener plates 301 are sealed against the assembly jig 398 by way of the assembly jig seal 399, the PCBs 330 themselves are sealed against the stiffener plates 301 by way of a bonding agent, such as a bead of adhesive or glue on the top side of the stiffener plate 301 where the stiffener plate 301 mates to the PCB 330. Once the vacuum source 367 is initiated, uniform negative pressure causing a downward force upon the PCB 330 against the stiffener plate 301 is then attained. The downward force may thus be maintained by way of the vacuum source 367 for as long as necessary as part of the manufacturing process while the bonding agent cures, thus permanently affixing the PCB 330 to the stiffener plate 301, after which termination of the vacuum source 367 releases the PCBs 330 and their bonded stiffener plates 301 to continue on to the next phase of assembly for units A . . . N.

Although units A . . . N are bonded as a batch, each stiffener plate 301 is bonded to a separate PCB at the assembly jig 398. In an alternative embodiment, each stiffener plate 301 is separate but is bonded to a strip of PCBs having the components 335 thereupon at the assembly jig 398, which thus forms a large single strip of connected PCBs each bonded to separate stiffener plates, and the strip of PCBs bonded to the separate stiffeners is then singulated after bonding. Stated differently, a single strip of PCB may encompass multiple individual PCBs for separate electronics modules, each with its own components, circuitry, etc., and subsequent to bonding of the strip of PCBs to the individual stiffener plates, the respective electronics modules (e.g., PCBs and stiffener plates) are physically and mechanically separated, for instance, by cutting, slicing, or other relevant separation means.

High Volume Manufacturing (HVM) is thus supported and scaling up volume is greatly simplified as the assembly jig 398 requires a plate with per-unit vacuum source 368 ports rather than complex machinery to press, clamp, or clip the PCBs 330 against the stiffener plates 301 for bonding. Additionally, the vacuum source 367 may be maintained during a variety of curing processes and times, including the use of ovens and heat. Still further, the downward pressure created by application of the vacuum source 367 may be precisely controlled for the duration of the bond curing processes, including varying the pressure as appropriate during different phases of the bond cure. Still further, the absence of complex moving parts simplifies maintenance of the assembly jig 398, speeds time to volume manufacturing, and decreases tool up costs.

The uniform negative pressure within the vacuum cavities 325 of the stiffener plates 301 and vacuum channel 365 of the assembly jig 398 is particularly advantageous because it prevents pressure points or stress points upon the PCB 330 which has sensitive components as well as components in sensitive alignment. Conversely, the conventional approach of utilizing clamps, clips, press-points, etc., can cause pinch-points and stress points which sometimes damage the PCBs at the time of manufacture or worse yet, may potentially induce micro-fractures or weak points which then lead to the units passing test only to exhibit an early life failure mode which in turn results in significant financial loss for the manufacturer, loss of good will, and increased consumer frustration.

The described methodologies may likewise be utilized for a wide array of semiconductor and electronics manufacturing processes well beyond those involving 3D camera PCBs specifically. For instance, many electronic products today must be made robust if they are to prevent their optical and other calibrated components from becoming misaligned during manufacture, shipping, and end use. For instance, while vacuum lamination of depth-sensing camera module PCBs to stiffener plates utilizing the described built-in vacuum channels is described by way of example, the methodologies are equally applicable to, for example, manufacture of PCBs for gesture control of PCB modules for computers which also use sensitive optics and a form of depth sensing, 3D photography equipment, 3D immersive gaming accessories, face recognition equipment, drone and robot control navigation circuitry, etc., all of which uses some form of depth sensing. Depth sensing technology itself may utilize cameras having stereoscopic imaging, coded light, or laser time of flight means.

Regardless of the particular means by which depth sensing is performed or the use case to which the PCB is applied, PCB modules which require a mechanically robust base to prevent optical and electronic components from becoming misaligned will benefit from the described means.

Another advantage of the described methodologies is that the stiffener plate 301 may serve a dual purpose by providing thermal dissipation in addition to providing mechanical strength. Optical components typically cannot withstand temperatures greater than 70 C. However, high performance depth sensing camera modules generate significant heat during operation, especially in their ASICs (Application-Specific Integrated Circuits). Therefore a heat sink is needed, which takes up space. The stiffener plate may therefore be utilized with such depth sensing camera module PCBs 330 to provide both mechanical strength and thermal dissipation while the method of vacuum lamination permits for greater use and efficiency the available space of the PCB 330 by enabling a non-contact method of manufacture for bonding the stiffener plate 301 to the PCB 330 and thus minimizing or outright eliminating keep-out and no-touch zones, which then in turn allows the PCB 330 to be more completely populated with passive and active components.

Figure 4A:
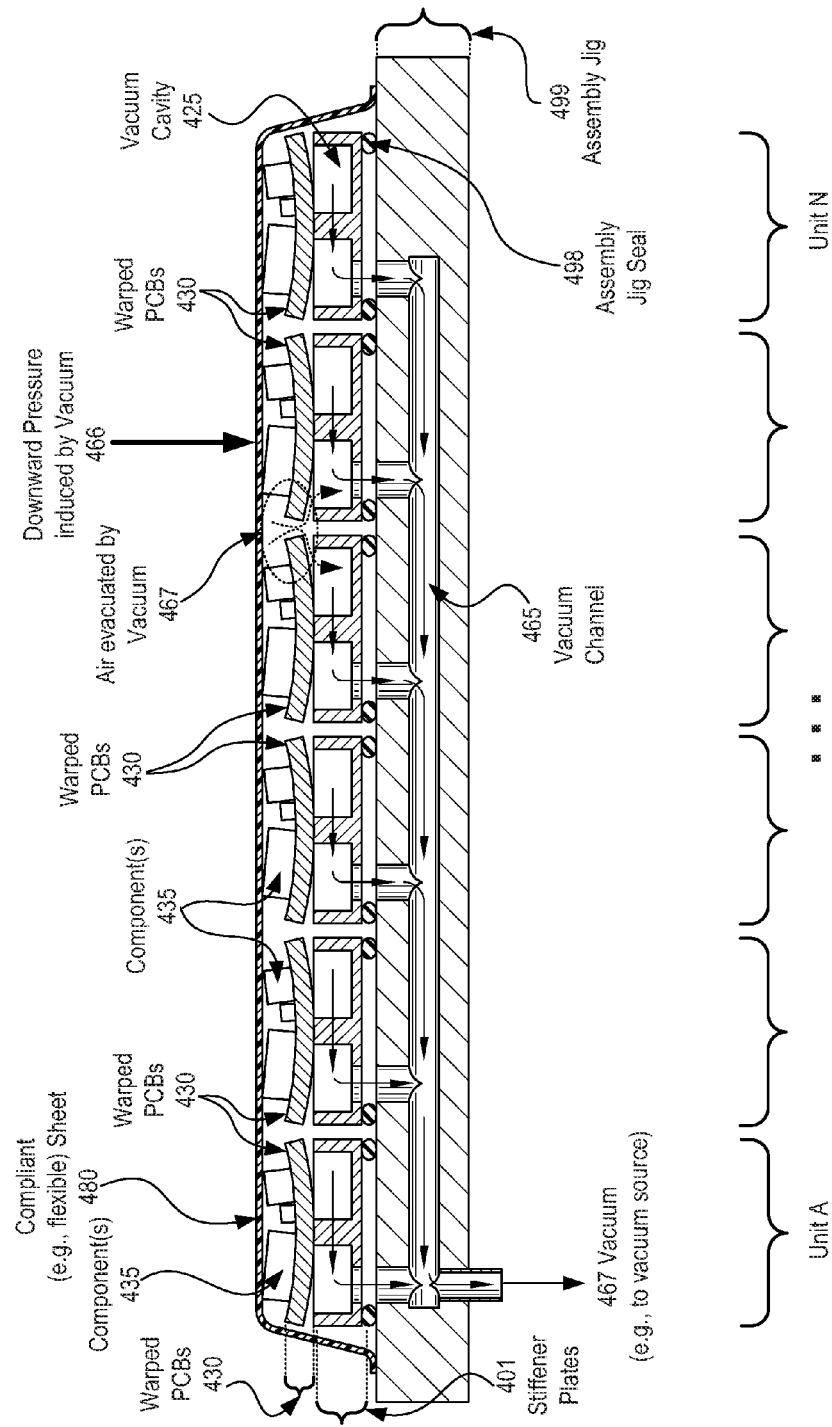
FIG. 4A depicts another assembly jig and vacuum channel in accordance with described embodiments.

FIG. 4A depicts another assembly jig and vacuum channel in accordance with described embodiments. In particular, there is depicted an assembly jig 499 and vacuum channel 465 for units A . . . N, each of which are undergoing manufacturing assembly. There is further depicted a series of warped PCBs 430 and stiffener plates 401 constituting the units A . . . N for assembly. Upon the warped PCBs 430 are components 435.

One problem which occurs is that while the stiffener plates 401 tend to be flat and coplanar, it is somewhat common for the PCBs themselves to not be perfectly flat, hence the depiction of the warped PCBs 430. Once bonded to the stiffener plates 401 the warped PCBs 430 will be flat and bonded in place to the stiffener plate 401 which is sufficiently strong to maintain the PCB in a flat orientation. The problem therefore is how to form a seal between a warped PCB 430 and the assembly jig 499 utilizing a vacuum source 467 such that the air may be evacuated by the vacuum as depicted at 467.

Although the stiffener plates 401, which are flat, will seal well against the assembly jig by way of the assembly jig seals 498, any warping in the PCBs themselves may prevent the PCB from sealing to, and thus bonding with the stiffener plate 401, even with a bead of bonding agent in place between the PCB and the stiffener plate.

It is therefore further depicted in accordance with this optional embodiment use of a compliant sheet 480, such as a flexible thin rubber sheet or other material, to fully cover the entire vacuum chamber, encompassing all of the units A . . . N on the assembly jig 499 and sealing at the top side of the assembly jig 499 on the lateral left and lateral right sides as is depicted.

With a compliant sheet 480 in place, the warped PCB 430 modules and the stiffener plates 401 may then be subjected to the vacuum source 467 which will evacuate the air via vacuum (e.g., to vacuum source at element 467) from the space between the compliant sheet 480 and the warped PCBs 430 creating a downward pressure induced by the vacuum (element 466) resulting in the PCBs being brought into a flat horizontal plane upon the stiffener plates 401 and held in place by the negative pressure from the vacuum source 467, such that the warped PCBs 430 may thus be bonded to the stiffener plates 401.

Although prior solutions which utilize clips, clamps, and press points are capable of mechanically holding warped PCBs 430 to a stiffener plate, they do not permit bonding of a warped PCB 430 in a satisfactory manner. The clips, clamps, and press points all require no-touch and keep out zones for manufacturing which then leaves space which cannot be utilized for functional components. Moreover, the clips, clamps, and press points do not produce a uniform pressure across the full surface of the warped PCB 430 being bonded, and as such, pressure and stress points are induced leading to potential damage and due to the lack of non-uniformity in the downward pressure by such conventional means, the warped PCBs when bonded often result in a non-uniform coupling where there are larger and smaller distances between the stiffener plate 401 and the bonded PCB do to the inadequate downward pressure applied in some spots and excessive pressure in other places.

Moreover, such approaches are well known to induce unwanted semi-permanent deformation in existing packages which in turn leads to a degradation in depth sensing accuracy given the sensitivity to alignment and calibration of these advanced electronics. Further still, use of clamps and clips is only practical for mobile products which are assembled in strip form, where the process creates bending in the regions of the strip closest to the edges and corners of the media. These conventional approaches result in a semi-permanent shape change in the package which negatively affects calibration and alignment. Further still, as the clips and clamps wear out, the induced shape change also becomes inconsistent, thus making it even more difficult to control end of line yield and negating any attempts to re-calibrate for a known shape change as the end-of line deformation resulting for such processes varies with time. Still further, even for PCBs which are made reasonably flat and coplanar (that is, they are not warped), some significant downward pressure is nevertheless required to create consistent bond line thicknesses in the adhesive so that the bonding process in of itself does not resulting a bonded PCB/stiffener plate assembly which is out of out of plane due to varying thicknesses in the bonding agent.

Conversely, the downward pressure induced by the vacuum 466 is made to be uniform across the entire bonding surface by both a wide distribution of the pressure applied by the compliant sheet 480 pressing upon the warped PCBs 430, providing greater uniformity as compared to point specific clips, clamps, and press points and further because of the negative pressure within the vacuum cavities 425 which effectively suctions or pulls the warped PCB 430 onto the stiffener plate 401 once a seal is attained, with the suctioning having full equilibrium in pressure throughout the vacuum cavities 425 of the respective units A . . . N on the assembly jig 499.

Figure 4B:
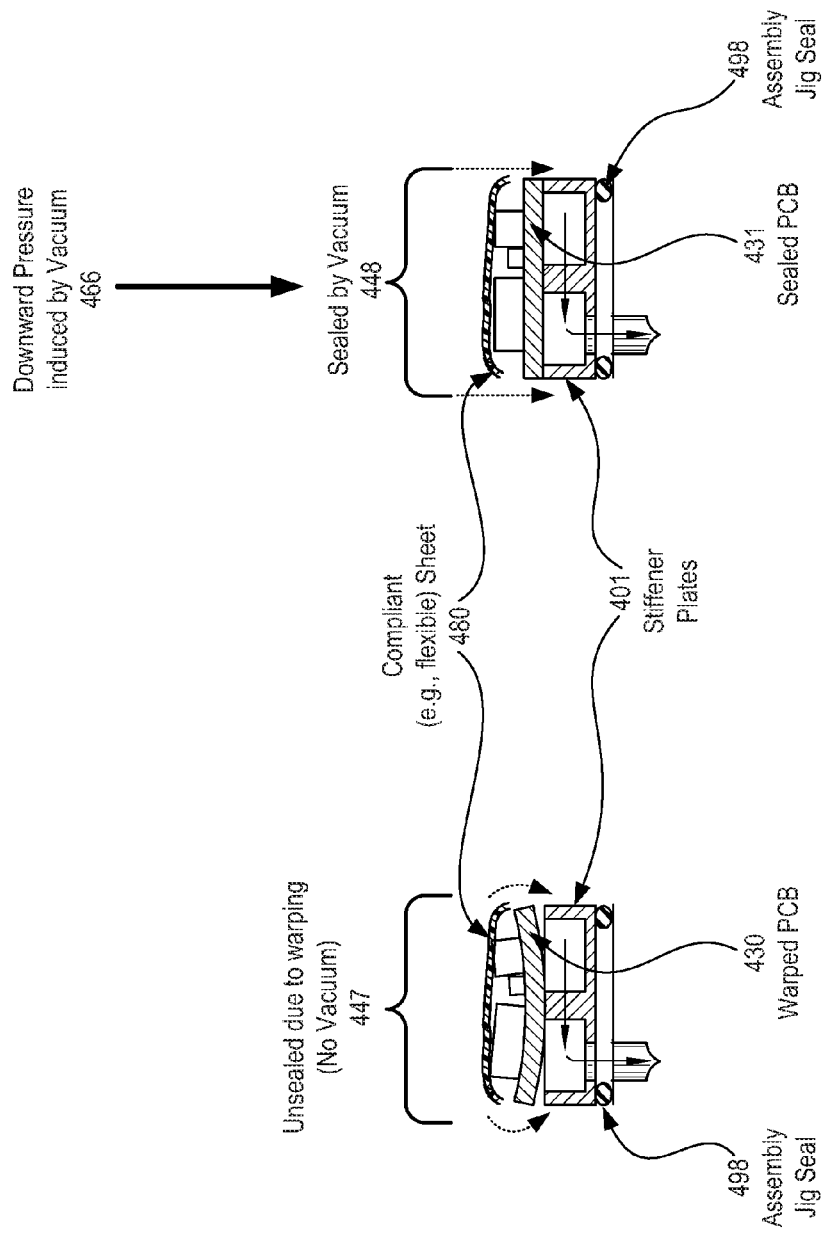
FIG. 4B depicts a PCB sealed to a stiffener plate by vacuum in accordance with described embodiments.

FIG. 4B depicts a PCB sealed to a stiffener plate by vacuum in accordance with described embodiments. As depicted on the left there is a warped PCB 430 upon the stiffener plate 401 which is unsealed due to warping (with no vacuum applied) 447. The compliant flexible sheet 480 is again depicted, through only the relevant portion which is directly over the unit N under assembly. As depicted on the right, once the vacuum source is applied, the air is evacuated from underneath the compliant flexible sheet 480 creating downward pressure induced by the vacuum 466 resulting in the PCB being sealed by vacuum 448 pressure against the stiffener plate 401 (depicted as sealed PCB 431).

As before, the stiffener plate 401 is sealed to the assembly jig 499 by way of the assembly jig seal 498.

In accordance with one embodiment, adhesive is dispensed onto the interior ribs (element 105 at FIG. 1) and the outer seal and support (element 115 of FIG. 1) prior to placing the PCB upon the stiffener plate. In accordance with one embodiment, vacuum pressure is initiated subsequent to placing the PCB upon the stiffener plate having the bonding agent or adhesive on the interior ribs and outer seal and support and the vacuum pressure is maintained through a manufacturing curing process for the adhesive/bonding agent. For instance, the curing process may include heating in an oven while the PCBs are held fast to the stiffener plate by the vacuum pressure thus permitting an even and uniform bonding agent/adhesive thickness when cured.

In accordance with one embodiment, the adhesive or bonding agent is a thermally cured adhesive which requires a high temperature curing process. In such an embodiment, temperature sensitive optical components which cannot withstand the high temperatures are installed onto the PCB subsequent to bonding the PCB to the stiffener plate. In an alternative embodiment, the temperature sensitive optical components which cannot withstand the high temperatures are installed onto the PCB prior to bonding the PCB to the stiffener plate, for instance, where at least some of the temperature sensitive optical components or other temperature sensitive components occupy space within one of the vacuum cavities, and as such, the curing process constitutes a low-heat or no-heat curing process to bond the PCB to the stiffener plate. Such a low-heat or no-heat curing process may therefore utilize a low temperature curing adhesive or a two-part adhesive having both a hardener and a resin. Such a low-heat or no-heat curing process may alternatively utilize adhesive that cures with UV light and a no-heat cure such that the components may be installed onto the PCB prior to bonding of the PCB to the stiffener plate.

FIG. 5 is a flow diagram illustrating a method for vacuum lamination of a depth-sensing camera module PCB to a stiffener using built-in vacuum channels in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 500 may be utilized in a variety of combinations.

At block 505 the method includes assembling an electronics module having components on a printed circuit board and a stiffener plate.

At block 510 the method includes affixing a plurality of top-side components to a top side of the printed circuit board.

At block 515 the method includes affixing a plurality of bottom-side components to the bottom side of the printed circuit board.

At block 520 the method includes sealing a stiffener plate to the bottom side of the printed circuit board, in which the stiffener plate includes a plurality of cavities to accommodate the plurality of bottom-side components affixed to the bottom side of the printed circuit board, and further in which the plurality of cavities are interconnected via one or more channels.

At block 525 the method includes applying a vacuum to the stiffener plate via a vacuum port of the stiffener plate to pull the printed circuit board onto the stiffener plate.

At block 530 the method includes bonding the stiffener plate to the bottom side of the printed circuit board while the printed circuit board is held to the stiffener plate via the vacuum.

In accordance with another embodiment of method 500, the process further includes applying a bead of adhesive to a top side of the stiffener plate; and in which sealing the stiffener plate to the bottom side of the printed circuit board includes attaching the top side of the stiffener plate to the bottom side of the printed circuit board, in which the bead of adhesive forms an air-tight seal between the stiffener plate and the printed circuit board.

In accordance with another embodiment of method 500, the bead of adhesive includes a bonding agent to bond the stiffener plate to the bottom side of the printed circuit board; in which the bonding agent includes one of: an epoxy; a glue; a low temperature curing adhesive; a high-heat curing adhesive; a two-part adhesive having both a hardener and a resin; a thermally activated adhesive which cures when exposed to heat; or an Ultra-Violet (UV) activated adhesive which cures when exposed to UV light.

In accordance with another embodiment of method 500, the process further includes applying a bonding agent between the top side of the stiffener plate and the bottom side of the printed circuit board; thermally curing the bonding agent while the printed circuit board is held to the stiffener plate via the vacuum; and affixing temperature sensitive optical components to the top side of the printed circuit board after thermally curing the bonding agent.

In accordance with another embodiment of method 500, the process further includes affixing temperature sensitive optical components to the printed circuit board before sealing the stiffener plate to the bottom side of the printed circuit board, in which the temperature sensitive optical components are affixed to either the bottom side of the printed circuit board or to the top side of the printed circuit board or to both the top and bottom sides of the printed circuit board; applying a bonding agent between the top side of the stiffener plate and the bottom side of the printed circuit board; and curing the bonding agent at temperature below 70 degrees Celsius while the printed circuit board is held to the stiffener plate via the vacuum, in which the temperature sensitive optical components cannot be exposed to heat in excess of 70 degrees Celsius.

In accordance with another embodiment of method 500, stiffener plate includes a plurality of pockets, recesses, voids, or spaces forming the cavities to receive the bottom side components of the printed circuit board when the printed circuit board is sealed to the stiffener plate; in which the channels are formed by vacuum interconnects machined into the stiffener plate; in which applying the vacuum to the stiffener plate via the vacuum port includes evacuating air from the stiffener plate sealed to the printed circuit board creating a negative pressure within the cavities of the stiffener plate to pull the printed circuit board onto the stiffener plate with a uniform force across the bottom side of the printed circuit board.

In accordance with another embodiment of method 500, the stiffener plate includes: an outer seal and support forming an inner chamber of the stiffener plate, the outer seal and support to mate with a bottom outside perimeter of the printed circuit board; a plurality of interior ribs dividing the inner chamber of the stiffener plate into the plurality of cavities of the stiffener plate, the interior ribs to mate with a bottom inside portion of the printed circuit board; and in which applying the vacuum to the stiffener plate creates a uniform pressure on the printed circuit board against the entirety of the outer seal and support and the plurality of interior ribs.

In accordance with another embodiment of method 500, the process further includes positioning the stiffener plate and the printed circuit board on an assembly jig; and in which applying the vacuum to the stiffener plate includes applying the vacuum to the stiffener plate via a vacuum source connected with the assembly jig, in which the vacuum port of the stiffener plate is connected with a vacuum channel of the assembly jig.

In accordance with another embodiment of method 500, the assembly jig holds multiple electronics modules under assembly simultaneously; in which each of the stiffener plates of the respective electronics modules are individual units; in which the printed circuit boards of the multiple electronics modules form a single strip of printed circuit boards which is placed over the stiffener plates of the respective electronics modules on the assembly jig; and in which the method further includes singulating the multiple electronics modules by separating the single strip of printed circuit boards into individual and separate electronics modules.

In accordance with another embodiment of method 500, the assembly jig holds multiple electronics modules under assembly simultaneously; in which each of the multiple electronics modules include a printed circuit board and a stiffener plate, the stiffener plate of each electronics module having a vacuum port therein; in which the method further includes interfacing the vacuum port of each respective stiffener plate of the multiple electronics modules under assembly simultaneously via the assembly jig with the vacuum channel of the assembly jig; and in which applying the vacuum to the stiffener plate includes applying the vacuum to all of the multiple electronics modules under assembly simultaneously via the vacuum channel of the assembly jig.

In accordance with another embodiment of method 500, the process further includes covering all of the multiple electronics modules under assembly via the assembly jig with a single compliant sheet; in which the compliant sheet forms an air-tight seal between the compliant sheet and the assembly jig, within which all of the multiple electronics modules under assembly via the assembly jig are enveloped; and in which applying the vacuum to all of the multiple electronics modules under assembly simultaneously via the vacuum channel of the assembly jig creates a downward pressure against the top of the multiple electronics modules under assembly via the assembly jig from the compliant sheet by evacuating air from between the compliant sheet and the assembly jig.

In accordance with another embodiment of method 500, one or more of the printed circuit boards of the multiple electronics modules under assembly via the assembly jig are sufficiently warped to prevent sealing between the respective printed circuit board and the respective stiffener plate on the assembly jig; in which the downward pressure against the top of the multiple electronics modules under assembly via the assembly jig from the compliant sheet by evacuating air from between the compliant sheet and the assembly jig seals the printed circuit boards against the stiffener plates by flatting the printed circuit boards against the stiffener plates; and in which the bonding includes bonding the one or more warped printed circuit boards of the multiple electronics modules under assembly to the respective stiffener plates on the assembly jig while the downward pressure from the compliant sheet seals the printed circuit boards against the stiffener plates by flatting the printed circuit boards against the stiffener plates.

In accordance with another embodiment of method 500, the electronics module includes one of: a gesture control electronics module for a computer; a 3D photography electronics module; a 3D immersive gaming electronics module; a face recognition electronics module to perform face recognition based security in-lieu of alphanumerical passwords; an image capture device electronics module having one or more optical and Complementary metal-oxide-semiconductor (CMOS) components affixed to the printed circuit board as the top side or bottom side components; a drone and robot control electronics module; a smart phone electronics module; a tablet electronics module; and a depth sensing camera electronics module to perform any of stereoscopic imaging depth sensing, coded light depth sensing, or laser time of flight depth sensing.

In accordance with another embodiment of method 500, the stiffener plate of the electronics module is composed of a metal or a metallic compound and functions as both a mechanical stiffener and also as a thermal dissipation heat sink for one or more of the top-side components and bottom side components affixed to the printed circuit board.

In accordance with another embodiment of method 500, bonding the stiffener plate to the bottom side of the printed circuit board while the printed circuit board is held to the stiffener plate via the vacuum includes performing a non-contact bonding operation, in which the non-contact bonding operation is completed without attaching clips, clamps, or a mechanical press against the printed circuit board and further in which the printed circuit board is void of no-touch zones and keep-out-zones.

Figure 6:
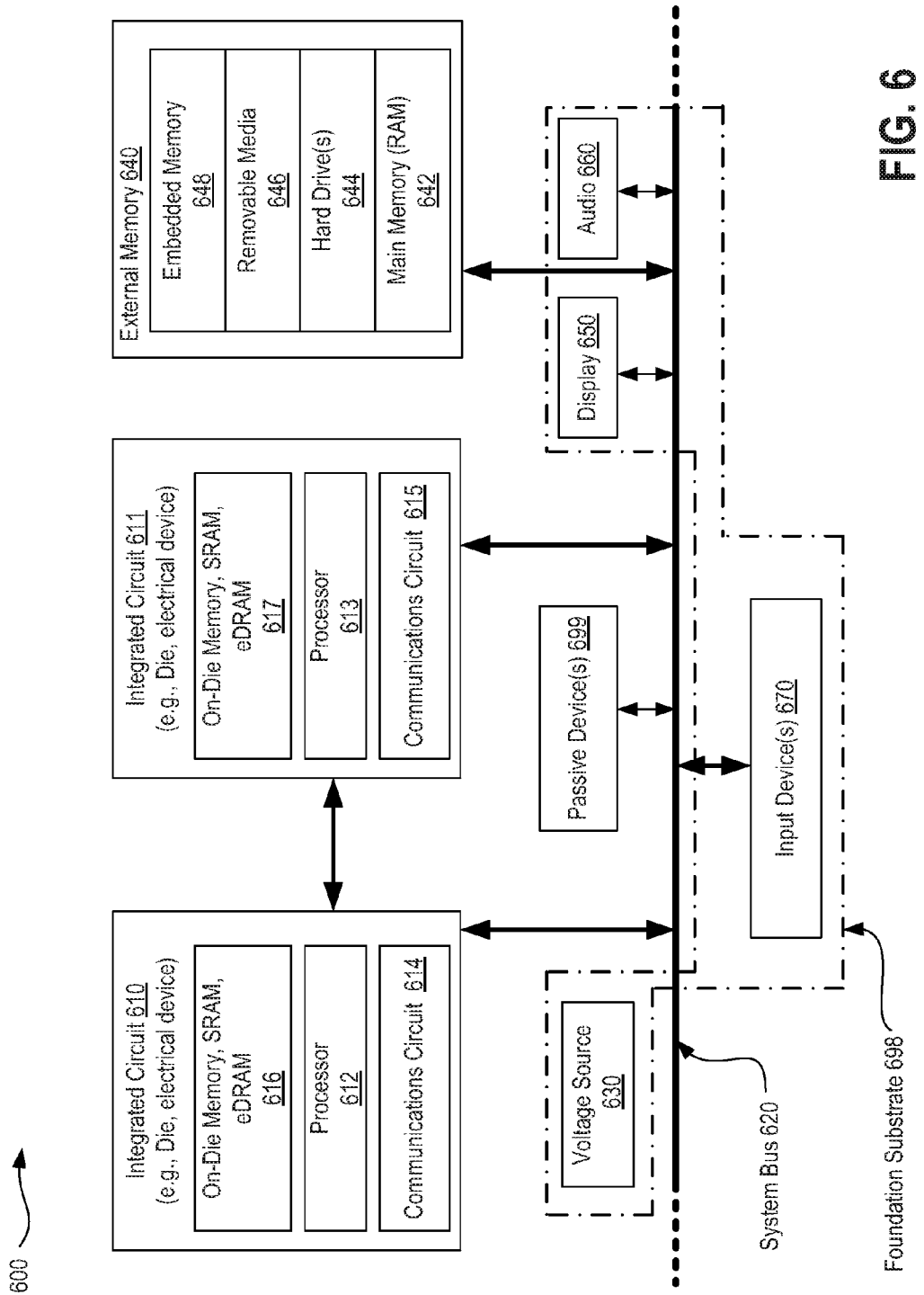
FIG. 6 is a schematic of a computer system, in accordance with an embodiment of the present invention.

FIG. 6 is a schematic of a computer system 600, in accordance with an embodiment of the present invention. The computer system 600 (also referred to as the electronic system 600) as depicted can embody vacuum lamination of depth-sensing camera module PCBs to stiffeners using built-in vacuum channels, according to any of the several disclosed embodiments and their equivalents as set forth in this disclosure. The computer system 600 may be a mobile device such as a net-book computer. The computer system 600 may be a mobile device such as a wireless smart phone or tablet. The computer system 600 may be a desktop computer. The computer system 600 may be a hand-held reader. The computer system 600 may be a server system. The computer system 600 may be a supercomputer or high-performance computing system.

In accordance with one embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

Such an integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes, or is coupled with, electrical devices having gradient encapsulant protection, as disclosed herein.

In accordance with one embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In accordance with one embodiment, the integrated circuit 610 is complemented with a subsequent integrated circuit 611. Useful embodiments include a dual processor 613 and a dual communications circuit 615 and dual on-die memory 617 such as SRAM. In accordance with one embodiment, the dual integrated circuit 610 includes embedded on-die memory 617 such as eDRAM.

In one embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in a die stack, according to an embodiment.

In accordance with one embodiment, the electronic system 600 also includes a display device 650 and an audio output 660. In one embodiment, the electronic system 600 includes an input device 670 such as a controller that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a package substrate having vacuum lamination of depth-sensing camera module PCBs to stiffeners using built-in vacuum channels, according to any of the several disclosed embodiments and their equivalents, an electronic system, a computer system, one or more methods of fabricating an integrated circuit, and one or more methods of fabricating an electronic assembly that includes a package substrate having vacuum lamination of depth-sensing camera module PCBs to stiffeners using built-in vacuum channels, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having vacuum lamination of depth-sensing camera module PCBs to stiffeners using built-in vacuum channel embodiments and their equivalents. A foundation substrate 698 may be included, as represented by the dashed line of FIG. 6. Passive devices 699 may also be included, as is also depicted in FIG. 6.

Figure 7A:
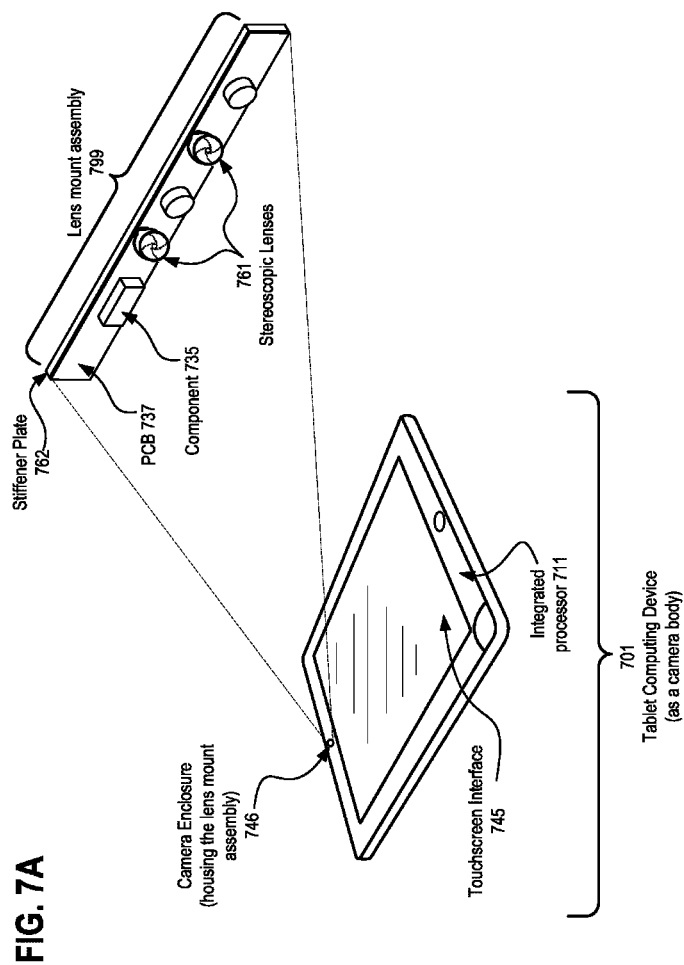
FIG. 7A illustrates an exemplary tablet computing device with a camera enclosure for a lens mount assembly in accordance with described embodiments.
Figure 7B:
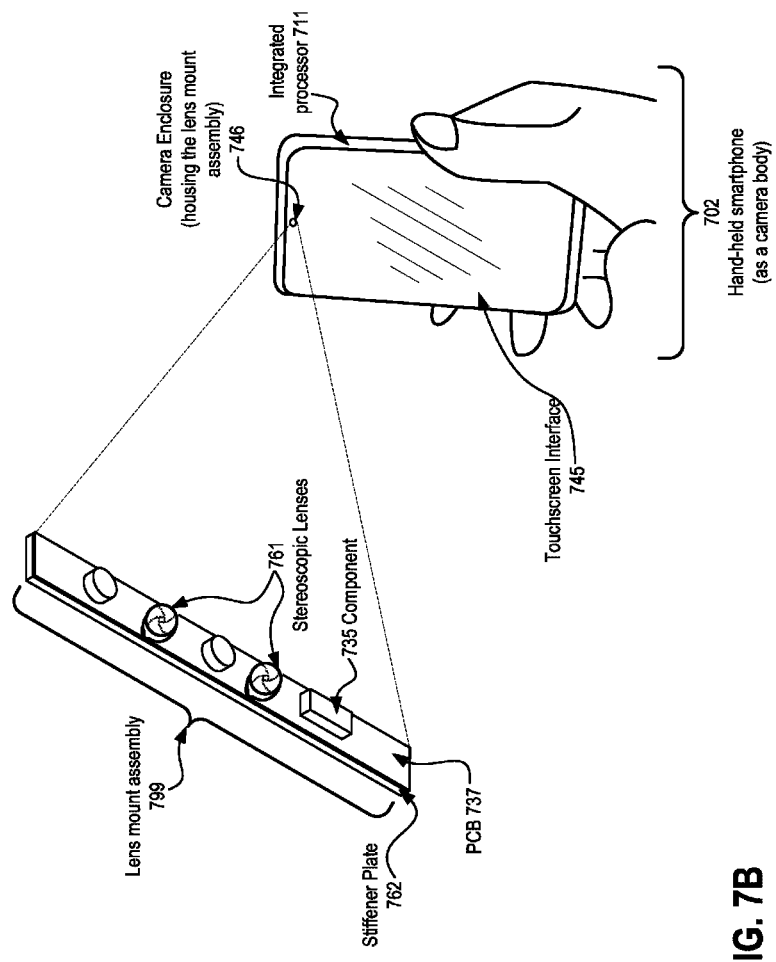
FIG. 7B illustrates an exemplary hand-held smartphone with a camera enclosure for a lens mount assembly in accordance with described embodiments.

FIG. 7A illustrates an exemplary tablet computing device 701 with a camera enclosure 746 (housing the lens mount assembly) for a lens mount assembly 799 which includes the stiffener plate 762 and PCB 737 with its components 735 and as depicted here, stereoscopic lenses 761, in accordance with described embodiments. FIG. 7B illustrates an exemplary hand-held smartphone 702 with a camera enclosure 746 (housing the lens mount assembly) for a lens mount assembly 799 in accordance with described embodiments.

For instance, according to the described embodiments, the lens mount assembly 799 having the stiffener plate 762 and PCB 737 with its components 735 as described previously is integrated within a consumer hand-held smartphone 702 or tablet computing device 701 as a camera body for the lens mount assembly 799.

In accordance with one embodiment, the consumer hand-held smartphone 702 or tablet computing device 701 having a touchscreen interface 745 integrated therein forms the camera body to which the lens mount assembly 799 is integrated or installed.

FIGS. 7A and 7B depict the tablet computing device 701 and the hand-held smartphone 702 each having a circuitry integrated therein as described in accordance with the embodiments. As depicted, each of the tablet computing device 701 and the hand-held smartphone 702 include a touchscreen interface 745 and an integrated processor 711 in accordance with disclosed embodiments.

For example, in one embodiment, a tablet computing device 701 or a hand-held smartphone 702, includes a display unit which includes a touchscreen interface 745 for the tablet or the smartphone and further in which memory and an integrated circuit operating as an integrated processor are incorporated into the tablet or smartphone, in which the integrated processor is operable in conjunction with the lens mount assemblies 799 having the stiffener plate 762 and PCB 737 with its components 735 described herein; the tablet or smartphone and its processing components being further operable to perform image capture and manipulation, perform depth sensing, etc. In one embodiment, the integrated circuit described above or the depicted integrated processor of the tablet or smartphone is an integrated silicon processor functioning as a central processing unit (CPU) and/or a Graphics Processing Unit (GPU) for a tablet computing device or a smartphone.

Figure 7C:
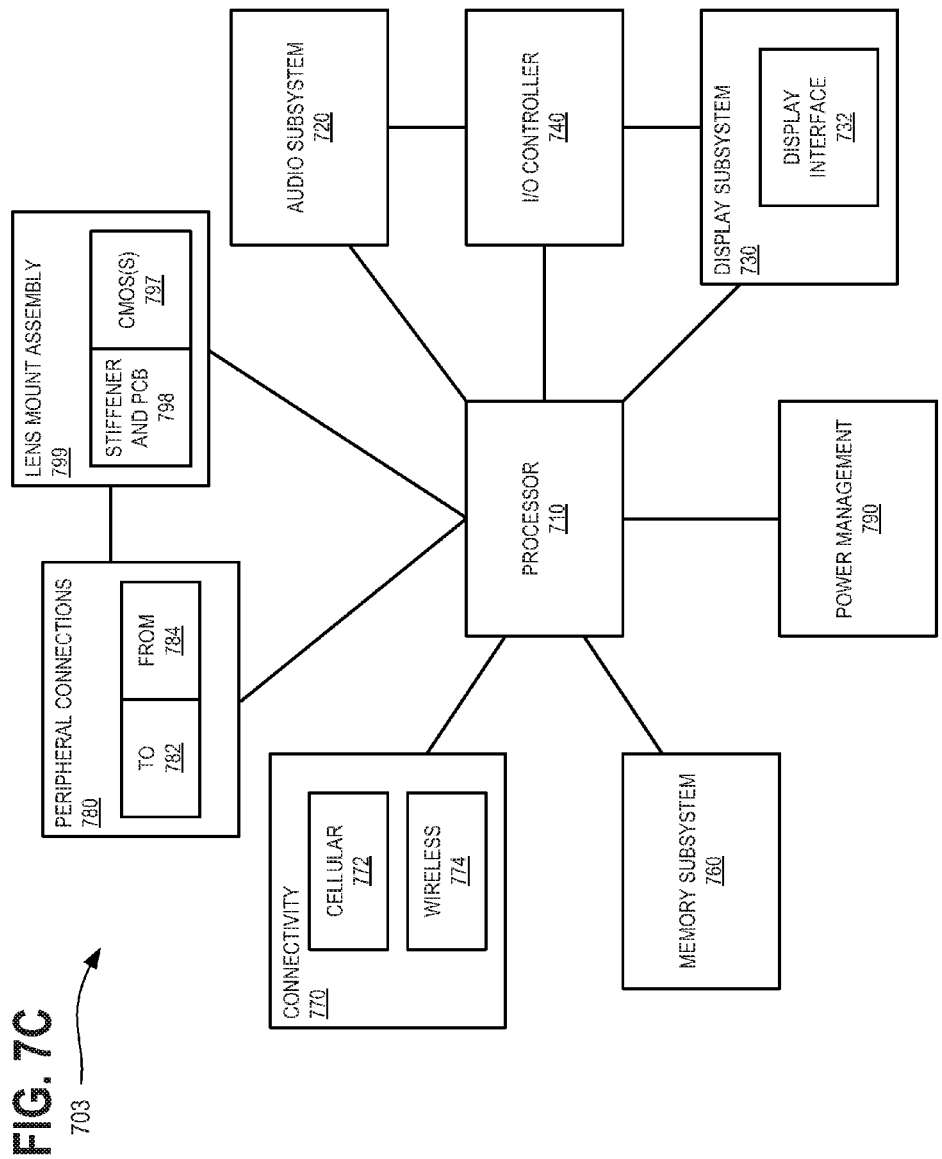
FIG. 7C is a block diagram of an embodiment of tablet computing device, a smart phone, or other mobile device having touchscreen interface connectors and a lens mount assembly and CMOS(s) integrated therein in accordance with described embodiments.

FIG. 7C is a block diagram 703 of an embodiment of tablet computing device, a smart phone, or other mobile device having touchscreen interface connectors and a lens mount assembly and CMOS(s) integrated therein in accordance with described embodiments. Processor 710 performs the primary processing operations. Audio subsystem 720 represents hardware (e.g., audio hardware and audio circuits) and software (e.g., drivers, codecs) components associated with providing audio functions to the computing device. In one embodiment, a user interacts with the tablet computing device or smart phone by providing audio commands that are received and processed by processor 710.

Lens mount assembly 799 is depicted as communicably interfaced to the processor 710 and peripheral connections 780. Lens mount assembly 799 includes stiffener and PCB 798 and CMOS(s) 797.

Display subsystem 730 represents hardware (e.g., display devices) and software (e.g., drivers) components that provide a visual and/or tactile display for a user to interact with the tablet computing device or smart phone. Display subsystem 730 includes display interface 732, which includes the particular screen or hardware device used to provide a display to a user. In one embodiment, display subsystem 730 includes a touchscreen device that provides both output and input to a user.

I/O controller 740 represents hardware devices and software components related to interaction with a user. I/O controller 740 can operate to manage hardware that is part of an audio subsystem 720 and/or display subsystem 730. Additionally, I/O controller 740 illustrates a connection point for additional devices that connect to the tablet computing device or smart phone through which a user might interact. In one embodiment, I/O controller 740 manages devices such as accelerometers, cameras, light sensors or other environmental sensors, or other hardware that can be included in the tablet computing device or smart phone. The input can be part of direct user interaction, as well as providing environmental input to the tablet computing device or smart phone.

In one embodiment, the tablet computing device or smart phone includes power management 790 that manages battery power usage, charging of the battery, and features related to power saving operation. Memory subsystem 760 includes memory devices for storing information in the tablet computing device or smart phone. Connectivity 770 includes hardware devices (e.g., wireless and/or wired connectors and communication hardware) and software components (e.g., drivers, protocol stacks) to the tablet computing device or smart phone to communicate with external devices. Cellular connectivity 772 may include, for example, wireless carriers such as GSM (global system for mobile communications), CDMA (code division multiple access), TDM (time division multiplexing), or other cellular service standards). Wireless connectivity 774 may include, for example, activity that is not cellular, such as personal area networks (e.g., Bluetooth), local area networks (e.g., WiFi), and/or wide area networks (e.g., WiMax), or other wireless communication.

Peripheral connections 780 include hardware interfaces and connectors, as well as software components (e.g., drivers, protocol stacks) to make peripheral connections as a peripheral device ("to" 782) to other computing devices, as well as have peripheral devices ("from" 784) connected to the tablet computing device or smart phone, including, for example, a "docking" connector to connect with other computing devices. Peripheral connections 780 include common or standards-based connectors, such as a Universal Serial Bus (USB) connector, DisplayPort including MiniDisplayPort (MDP), High Definition Multimedia Interface (HDMI), Firewire, etc.

In accordance with one embodiment, there is an electronics module which includes a printed circuit board; a plurality of top-side components affixed to a top side of the printed circuit board; a plurality of bottom-side components affixed to the bottom side of the printed circuit board; a stiffener plate attached to the bottom side of the printed circuit board; in which the stiffener plate includes a plurality of cavities to accommodate the plurality of bottom-side components affixed to the bottom side of the printed circuit board, the plurality of cavities being interconnected via one or more channels; and a vacuum port in the stiffener plate to receive a vacuum source, the stiffener plate having been bonded and cured to the printed circuit board while the printed circuit board was held to the stiffener plate via the vacuum source.

According to one embodiment, the electronics module constitutes one of: a gesture control electronics module for a computer; a 3D photography electronics module; a 3D immersive gaming electronics module; a face recognition electronics module to perform face recognition base security in-lieu of alphanumerical passwords; an image capture device electronics module having one or more optical and Complementary metal-oxide-semiconductor (CMOS) components affixed to the printed circuit board as the top side or bottom side components; a drone and robot control electronics module; a smart phone electronics module; a tablet electronics module; and a depth sensing camera electronics module to perform any of stereoscopic imaging depth sensing, coded light depth sensing, or laser time of flight depth sensing.

According to a particular embodiment, there is a camera body assembly, including: a camera body; a battery; a display; a processor and a memory to perform logic or instructions; a lens mount assembly, the lens mount assembly, including one or more optical components and Complementary metal-oxide-semiconductor (CMOS) components; an electronics module interfaced with the lens mount assembly, the electronics module having integrated therein: a printed circuit board; a plurality of top-side components affixed to a top side of the printed circuit board; a plurality of bottom-side components affixed to the bottom side of the printed circuit board; a stiffener plate attached to the bottom side of the printed circuit board; in which the stiffener plate includes a plurality of cavities to accommodate the plurality of bottom-side components affixed to the bottom side of the printed circuit board, the plurality of cavities being interconnected via one or more channels and in which the stiffener plate further includes a vacuum port in the stiffener plate to receive a vacuum source, the stiffener plate having been bonded and cured to the printed circuit board while the printed circuit board was held to the stiffener plate via the vacuum source.

According to a particular embodiment, the camera body assembly is one of: a gesture control system, a 3D photography system, a 3D immersive gaming system, a face recognition system to perform face recognition based security in-lieu of alphanumerical passwords, a drone or robot control system, a depth sensing camera system to perform any of stereoscopic imaging depth sensing, coded light depth sensing, or laser time of flight depth sensing, a hand-held stand-alone camera, a tablet computing device, and a hand-held smartphone; and according to such an embodiment, the lens mount assembly is integrated into the camera body by an Original Equipment Manufacturer (OEM) for the gesture control system, the 3D photography system, the 3D immersive gaming system, the face recognition system, the drone or robot control system, the depth sensing camera system, the hand-held stand-alone camera, the tablet computing device, or the hand-held smartphone.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

What is claimed is:

1. A method of assembling an electronics module, the method comprising:
    affixing a plurality of top-side components to a top side of a printed circuit board;
    affixing a plurality of bottom-side components to the bottom side of the printed circuit board;
    sealing a stiffener plate to the bottom side of the printed circuit board, wherein the stiffener plate comprises a plurality of cavities to accommodate the plurality of bottom-side components affixed to the bottom side of the printed circuit board, and wherein the plurality of cavities are interconnected via one or more channels;
    applying a vacuum to the stiffener plate via a vacuum port of the stiffener plate to pull the printed circuit board onto the stiffener plate; and
    bonding the stiffener plate to the bottom side of the printed circuit board while the printed circuit board is held to the stiffener plate via the vacuum.

2. The method of claim 1, further comprising:
    applying a bead of adhesive to a top side of the stiffener plate; and
    wherein sealing the stiffener plate to the bottom side of the printed circuit board comprises attaching the top side of the stiffener plate to the bottom side of the printed circuit board, wherein the bead of adhesive forms an air-tight seal between the stiffener plate and the printed circuit board.

3. The method of claim 2,
    wherein the bead of adhesive comprises a bonding agent to bond the stiffener plate to the bottom side of the printed circuit board;
    wherein the bonding agent comprises one of:
    an epoxy;
    a glue;
    a low temperature curing adhesive;
    a high-heat curing adhesive;
    a two-part adhesive having both a hardener and a resin;
    a thermally activated adhesive which cures when exposed to heat; or
    an Ultra-Violet (UV) activated adhesive which cures when exposed to UV light.

4. The method of claim 1, further comprising:
    applying a bonding agent between the top side of the stiffener plate and the bottom side of the printed circuit board;
    thermally curing the bonding agent while the printed circuit board is held to the stiffener plate via the vacuum; and
    affixing temperature sensitive optical components to the top side of the printed circuit board after thermally curing the bonding agent.

5. The method of claim 1, further comprising:
    affixing temperature sensitive optical components to the printed circuit board before sealing the stiffener plate to the bottom side of the printed circuit board, wherein the temperature sensitive optical components are affixed to either the bottom side of the printed circuit board or to the top side of the printed circuit board or to both the top and bottom sides of the printed circuit board;
    applying a bonding agent between the top side of the stiffener plate and the bottom side of the printed circuit board; and
    curing the bonding agent at temperature below 70 degrees Celsius while the printed circuit board is held to the stiffener plate via the vacuum, wherein the temperature sensitive optical components cannot be exposed to heat in excess of 70 degrees Celsius.

6. The method of claim 1, wherein stiffener plate comprises a plurality of pockets, recesses, voids, or spaces forming the cavities to receive the bottom side components of the printed circuit board when the printed circuit board is sealed to the stiffener plate;
    wherein the channels are formed by vacuum interconnects machined into the stiffener plate;
    wherein applying the vacuum to the stiffener plate via the vacuum port comprises evacuating air from the stiffener plate sealed to the printed circuit board creating a negative pressure within the cavities of the stiffener plate to pull the printed circuit board onto the stiffener plate with a uniform force across the bottom side of the printed circuit board.

7. The method of claim 1, wherein the stiffener plate comprises:
    an outer seal and support forming an inner chamber of the stiffener plate, the outer seal and support to mate with a bottom outside perimeter of the printed circuit board;
    a plurality of interior ribs dividing the inner chamber of the stiffener plate into the plurality of cavities of the stiffener plate, the interior ribs to mate with a bottom inside portion of the printed circuit board; and
    wherein applying the vacuum to the stiffener plate creates a uniform pressure on the printed circuit board against the entirety of the outer seal and support and the plurality of interior ribs.

8. The method of claim 1, further comprising:
    positioning the stiffener plate and the printed circuit board on an assembly jig; and
    wherein applying the vacuum to the stiffener plate comprises applying the vacuum to the stiffener plate via a vacuum source connected with the assembly jig, wherein the vacuum port of the stiffener plate is connected with a vacuum channel of the assembly jig.

9. The method of claim 8:
    wherein the assembly jig holds multiple electronics modules under assembly simultaneously;
    wherein each of the stiffener plates of the respective electronics modules are individual units;
    wherein the printed circuit boards of the multiple electronics modules form a single strip of printed circuit boards which is placed over the stiffener plates of the respective electronics modules on the assembly jig; and
    wherein the method further comprises singulating the multiple electronics modules by separating the single strip of printed circuit boards into individual and separate electronics modules.

10. The method of claim 8:
    wherein the assembly jig holds multiple electronics modules under assembly simultaneously;
    wherein each of the multiple electronics modules include a printed circuit board and a stiffener plate, the stiffener plate of each electronics module having a vacuum port therein;
    wherein the method further comprises interfacing the vacuum port of each respective stiffener plate of the multiple electronics modules under assembly simultaneously via the assembly jig with the vacuum channel of the assembly jig; and wherein applying the vacuum to the stiffener plate comprises applying the vacuum to all of the multiple electronics modules under assembly simultaneously via the vacuum channel of the assembly jig.

11. The method of claim 10, further comprising:

covering all of the multiple electronics modules under assembly via the assembly jig with a single compliant sheet;

wherein the compliant sheet forms an air-tight seal between the compliant sheet and the assembly jig, within which all of the multiple electronics modules under assembly via the assembly jig are enveloped; and wherein applying the vacuum to all of the multiple electronics modules under assembly simultaneously via the vacuum channel of the assembly jig creates a downward pressure against the top of the multiple electronics modules under assembly via the assembly jig from the compliant sheet by evacuating air from between the compliant sheet and the assembly jig.

12. The method of claim 11:

wherein one or more of the printed circuit boards of the multiple electronics modules under assembly via the assembly jig are sufficiently warped to prevent sealing between the respective printed circuit board and the respective stiffener plate on the assembly jig;

wherein the downward pressure against the top of the multiple electronics modules under assembly via the assembly jig from the compliant sheet by evacuating air from between the compliant sheet and the assembly jig seals the printed circuit boards against the stiffener plates by flatting the printed circuit boards against the stiffener plates; and wherein the bonding comprises bonding the one or more warped printed circuit boards of the multiple electronics modules under assembly to the respective stiffener plates on the assembly jig while the downward pressure from the compliant sheet seals the printed circuit boards against the stiffener plates by flatting the printed circuit boards against the stiffener plates.

13. The method of claim 1, wherein the electronics module comprises one of:

a gesture control electronics module for a computer;
a 3D photography electronics module;
a 3D immersive gaming electronics module;
a face recognition electronics module to perform face recognition based security in-lieu of alphanumerical passwords;
an image capture device electronics module having one or more optical and Complementary metal-oxide-semiconductor (CMOS) components affixed to the printed circuit board as the top side or bottom side components;
a drone and robot control electronics module;
a smart phone electronics module;
a tablet electronics module; and
a depth sensing camera electronics module to perform any of stereoscopic imaging depth sensing, coded light depth sensing, or laser time of flight depth sensing.

14. The method of claim 1, wherein the stiffener plate of the electronics module is composed of a metal or a metallic compound and functions as both a mechanical stiffener and also as a thermal dissipation heat sink for one or more of the top-side components and bottom side components affixed to the printed circuit board.

15. The method of claim 1, wherein bonding the stiffener plate to the bottom side of the printed circuit board while the printed circuit board is held to the stiffener plate via the vacuum comprises performing a non-contact bonding operation, wherein the non-contact bonding operation is completed without attaching clips, clamps, or a mechanical press against the printed circuit board and further wherein the printed circuit board is void of no-touch zones and keep-out-zones.

16. An electronics module comprising:

a printed circuit board;
a plurality of top-side components affixed to a top side of the printed circuit board;
a plurality of bottom-side components affixed to the bottom side of the printed circuit board;
a stiffener plate attached to the bottom side of the printed circuit board;
wherein the stiffener plate comprises a plurality of cavities to accommodate the plurality of bottom-side components affixed to the bottom side of the printed circuit board, the plurality of cavities being interconnected via one or more channels; and
a vacuum port in the stiffener plate to receive a vacuum source, the stiffener plate having been bonded and cured to the printed circuit board while the printed circuit board was held to the stiffener plate via the vacuum source.

17. The electronics module of claim 16, further comprising:

a bead of adhesive between a top side of the stiffener plate and the bottom side of the printed circuit board; and
wherein the bead of adhesive forms an air-tight seal between the stiffener plate and the printed circuit board.

18. The electronics module of claim 17:

wherein the bead of adhesive comprises a bonding agent to bond the stiffener plate to the bottom side of the printed circuit board;
wherein the bonding agent comprises one of:
an epoxy;
a glue;
a low temperature curing adhesive;
a high-heat curing adhesive;
a two-part adhesive having both a hardener and a resin;
a thermally activated adhesive which cures when exposed to heat; or
an Ultra-Violet (UV) activated adhesive which cures when exposed to UV light.

19. The electronics module of claim 16, wherein the stiffener plate comprises:

an outer seal and support forming an inner chamber of the stiffener plate, the outer seal and support to mate with a bottom outside perimeter of the printed circuit board;
a plurality of interior ribs dividing the inner chamber of the stiffener plate into the plurality of cavities of the stiffener plate, the interior ribs to mate with a bottom inside portion of the printed circuit board; and
wherein the vacuum source creates a uniform pressure on the printed circuit board against the entirety of the outer seal and support and the plurality of interior ribs.

20. The electronics module of claim 16, wherein the electronics module comprises one of:

a gesture control electronics module for a computer;
a 3D photography electronics module;
a 3D immersive gaming electronics module;
a face recognition electronics module to perform face recognition base security in-lieu of alphanumerical passwords;

an image capture device electronics module having one or more optical and Complementary metal-oxide-semiconductor (CMOS) components affixed to the printed circuit board as the top side or bottom side components;
a drone and robot control electronics module;
a smart phone electronics module;
a tablet electronics module; and
a depth sensing camera electronics module to perform any of stereoscopic imaging depth sensing, coded light depth sensing, or laser time of flight depth sensing.

21. The electronics module of claim 16, wherein the stiffener plate of the electronics module is composed of a metal or a metallic compound and functions as both a mechanical stiffener and also as a thermal dissipation heat sink for one or more of the top-side components and bottom side components affixed to the printed circuit board.

22. The electronics module of claim 16, wherein the stiffener plate is bonded to the bottom side of the printed circuit board via a non-contact bonding operation, wherein the non-contact bonding operation is completed without attaching clips, clamps, or a mechanical press against the printed circuit board and further wherein the printed circuit board is void of no-touch zones and keep-out-zones.

23. A camera body assembly, comprising:
a camera body;
a battery;
a display;
a processor and a memory to perform logic or instructions;
a lens mount assembly, the lens mount assembly, including one or more optical components and Complementary metal-oxide-semiconductor (CMOS) components;
an electronics module interfaced with the lens mount assembly, the electronics module having integrated therein:
a printed circuit board;
a plurality of top-side components affixed to a top side of the printed circuit board;
a plurality of bottom-side components affixed to the bottom side of the printed circuit board;
a stiffener plate attached to the bottom side of the printed circuit board;
wherein the stiffener plate includes a plurality of cavities to accommodate the plurality of bottom-side components affixed to the bottom side of the printed circuit board, the plurality of cavities being interconnected via one or more channels and wherein the stiffener plate further includes a vacuum port in the stiffener plate to receive a vacuum source, the stiffener plate having been bonded and cured to the printed circuit board while the printed circuit board was held to the stiffener plate via the vacuum source.

24. The camera body assembly of claim 23, wherein the electronics module comprises one of:
a gesture control electronics module for a computer;
a 3D photography electronics module;
a 3D immersive gaming electronics module;
a face recognition electronics module to perform face recognition base security in-lieu of alphanumerical passwords;
an image capture device electronics module having one or more optical and Complementary metal-oxide-semiconductor (CMOS) components affixed to the printed circuit board as the top side or bottom side components;
a drone and robot control electronics module;
a smart phone electronics module;
a tablet electronics module; and
a depth sensing camera electronics module to perform any of stereoscopic imaging depth sensing, coded light depth sensing, or laser time of flight depth sensing.

25. The camera body assembly of claim 23:
wherein the camera body comprises one of: a gesture control system, a 3D photography system, a 3D immersive gaming system, a face recognition system to perform face recognition based security in-lieu of alphanumerical passwords, a drone or robot control system, a depth sensing camera system to perform any of stereoscopic imaging depth sensing, coded light depth sensing, or laser time of flight depth sensing, a hand-held stand-alone camera, a tablet computing device, and a hand-held smartphone; and
wherein the lens mount assembly is integrated into the camera body by an Original Equipment Manufacturer (OEM) for the gesture control system, the 3D photography system, the 3D immersive gaming system, the face recognition system, the drone or robot control system, the depth sensing camera system, the hand-held stand-alone camera, the tablet computing device, or the hand-held smartphone.

* * * * *